United States Patent
Shevchenko et al.

(10) Patent No.: US 10,796,806 B2
(45) Date of Patent: Oct. 6, 2020

(54) FIRST WALL CONDITIONING IN A FUSION REACTOR VESSEL

(71) Applicant: Tokamak Energy Ltd., Abingdon, Oxfordshire (GB)

(72) Inventors: Vladimir Shevchenko, Abingdon (GB); Christian Bradley, Abingdon (GB)

(73) Assignee: Tokamak Energy Ltd., Oxfordshire (GB)

( * ) Notice: Subject to any disclaimer, the term of this patent is extended or adjusted under 35 U.S.C. 154(b) by 0 days.

(21) Appl. No.: 16/485,914

(22) PCT Filed: Feb. 7, 2018

(86) PCT No.: PCT/GB2018/050338
§ 371 (c)(1),
(2) Date: Aug. 14, 2019

(87) PCT Pub. No.: WO2018/150159
PCT Pub. Date: Aug. 23, 2018

(65) Prior Publication Data
US 2020/0058412 A1 Feb. 20, 2020

(30) Foreign Application Priority Data
Feb. 17, 2017 (GB) .................................. 1702581.8

(51) Int. Cl.
*G21B 1/13* (2006.01)
*C23C 14/04* (2006.01)
(Continued)

(52) U.S. Cl.
CPC .............. *G21B 1/13* (2013.01); *C23C 14/046* (2013.01); *C23C 14/0647* (2013.01);
(Continued)

(58) Field of Classification Search
CPC ............. G21B 1/13; H05H 2001/5645; H05H 2001/466; H05H 2001/4645
See application file for complete search history.

(56) References Cited

U.S. PATENT DOCUMENTS 3,258,402 A * 6/1966 Farnsworth .............. H05H 1/03
376/107
3,663,361 A * 5/1972 Yoshikawa ............ G21B 1/057
376/136
(Continued)

FOREIGN PATENT DOCUMENTS

| CN | 102653856 B | 12/2013 |
| CN | 106319460 A | 1/2017 |
| JP | S5662964 A | 5/1981 |

OTHER PUBLICATIONS

Lesnyakov, G.G. and Volkov, E.D. "Toroidal stellarator diode: discharge features and electron transport" Plasma Devices and Operations 2006, vol. 14, No. 2, pp. 1111-1136. (Year: 2006).*
(Continued)

*Primary Examiner* — Sharon M Davis
(74) *Attorney, Agent, or Firm* — Michael Best & Friedrich LLP

(57) ABSTRACT

An apparatus for protecting an interior surface of a fusion reactor vessel. The apparatus comprises a power supply operably connected to an electrode for insertion into the vessel. The apparatus supports a solid material within the vessel, and is configured such that power supplied to the electrode within the vessel causes a plasma located in proximity to the solid material to sputter the solid material in order to deposit a protective material on said interior surface.

12 Claims, 4 Drawing Sheets

(51) Int. Cl.
  *C23C 14/06* (2006.01)
  *C23C 14/16* (2006.01)
  *C23C 14/34* (2006.01)
  *G21B 1/05* (2006.01)
  *G21B 1/21* (2006.01)

(52) U.S. Cl.
  CPC ........ *C23C 14/165* (2013.01); *C23C 14/3421* (2013.01); *G21B 1/05* (2013.01); *G21B 1/21* (2013.01)

(56) References Cited

U.S. PATENT DOCUMENTS

| | | | |
|---|---|---|---|
| 3,663,362 A | | 5/1972 | Stix |
| 4,414,176 A * | | 11/1983 | Krauss ..................... G21B 1/13 376/136 |
| 5,225,146 A * | | 7/1993 | Ono ........................ G21B 1/057 376/129 |
| 5,372,686 A | | 12/1994 | Timberlake et al. |
| 5,512,164 A | | 4/1996 | Timberlake |
| 8,593,064 B2 * | | 11/2013 | Chang Diaz .......... F03H 1/0093 315/111.61 |
| 2006/0225998 A1 | | 10/2006 | Song |
| 2006/0284562 A1 * | | 12/2006 | Hruby .................. H01J 27/143 315/111.61 |
| 2010/0046688 A1 * | | 2/2010 | Kotschenreuther ...... G21B 1/05 376/134 |
| 2010/0066252 A1 * | | 3/2010 | Reijonen .................. H05H 3/06 315/111.81 |
| 2010/0284501 A1 * | | 11/2010 | Rogers ..................... G21B 1/17 376/107 |
| 2016/0276044 A1 * | | 9/2016 | Tuszewski ............. G21B 1/052 |

OTHER PUBLICATIONS

Search Report issued from the United Kingdom Patent Office for related Application No. GB1702581.8 dated Aug. 29, 2017 (4 pages).
Further Search Report issued from the United Kingdom Patent Office for related Application No. GB1702581.8 dated Jul. 9, 2018 (2 pages).
International search Report with Written Opinion for related Application No. PCT/GB2018/050338 dated Jul. 23, 2018 (19 pages).
Second Written Opinion for Related Application No. PCT/GB2018/050338 dated Jan. 21, 2019 (6 pages).
International Preliminary Report on Patentability for related Application No. PCT/GB2018/050338 dated Mar. 22, 2019 (7 pages).
M. Ono et al., "Steady-statetokamak discharge via dc helicity injection" Physical Review Letters, vol. 59, No. 19, Nov. 1, 1987 pp. 2165-2168.
N.W. Eidietis, et al., "Non-inductive Production of ST Plasmas with Washer Gun Sources on the Pegasus Toroidal Experiment", Journal of Fusion Energy, vol. 26, No. 1-2, Jan. 20, 2007, pp. 43-46.
G. Lynn et al., "The HelCat dual-source plasma device," Review of Scientific Instruments, vol. 80, No. 10, dated Oct. 2, 2009, pp. 103501-1 to 103501-8.
A. Ejiri et al., "Non-inductive plasma current start-up by EC and RF power in the TST-2 spherical tokamak," Nuclear Fusion, 2009, vol. 49, No. 6, p. 65010(1-12).

* cited by examiner

FIRST WALL CONDITIONING IN A FUSION REACTOR VESSEL

FIELD OF THE INVENTION

The present invention relates to a method and apparatus for first wall conditioning of the interior walls of a fusion reaction vessel such as a spherical tokamak.

BACKGROUND

The challenge of producing fusion power is hugely complex. In addition to the fundamental challenge of confining and sustaining a fusion reaction, a vast number of engineering problems arise during the development and operation of fusion devices.

The tokamak is a well-known class of fusion device which uses magnetic fields to confine high temperature plasma within a toroidal reactor vessel. The formation of the plasma must be carefully controlled in order for the tokamak to operate safely and efficiently. It is also important to protect plasma facing components from direct exposure to the hot plasma.

Boronisation is a well-established method for protecting plasma facing components. In tokamaks, this is known as first wall conditioning. If a protecting layer of boron is applied correctly to the lining or "first wall" of the reactor vessel, the layer significantly reduces the influx of heavy ions from the interior wall during operation of the tokamak. Plasma performance is improved due to a reduction in radiation losses and improved energy confinement.

The most common method of boronisation is based on chemical vapour deposition (CVD) of elemental boron by glow discharge in a helium atmosphere containing boron hydrides (boranes) in a gaseous state. One of the most popular boranes for this method is decaborane, which appears as a white crystalline compound at a room temperature and can be sublimed under vacuum at moderate temperatures. However, decaborane is highly flammable, toxic in contact with skin and if swallowed, and very toxic by inhalation. Additionally, decaborane poses an explosion risk, either as the result of forming an explosive mixture with oxygen or through the liberation of hydrogen gas when in contact with water.

Gaseous decaborane is prepared from the crystalline state by sublimation under vacuum. The vapour is then introduced into the reactor vessel with helium gas at total pressure of several mbar. A glow discharge cleaning (GDC) procedure is run within the vessel. The GDC procedure is used to remove impurities from the interior surfaces of the reactor vessel. The GDC also causes breakdown of the decaborane, thereby depositing elemental boron on the interior surfaces of the vessel. Initial boronisation usually takes a few hours.

Deuterated decaborane must be used in the fusion reactors operating on deuterium to avoid hydrogen contamination. A procedure for boronisation using deuterated decaborane has been used at the JT-60 tokamak (Japan) for more than a decade. However, to our knowledge, production of deuterated decaborane was suspended several years ago. JT-60 and other fusion reactor should switch to gaseous deuterated boranes such as deuterated trimethyl boron which are even more toxic, highly flammable and potentially explosive.

A procedure for boronisation using gaseous forms of deuterated boron has been used at the Mega Ampere Spherical Tokamak (MAST, UK) and the National Spherical Torus eXperiment (NSTX, USA).

Lithiumisation is another approach to first wall conditioning. Lithium melts at 180.5° C. and its boiling point is 1330° C. For efficient evaporation it is sufficient to achieve high enough vapour pressure. For example, Li vapour pressure reaches 1 mbar at 722° C. Lithiumisation is therefore simpler than boronisation to some extent because Li vapour can be introduced into the vessel. Direct evaporation may not, however, produce uniform distribution of Li around the vessel.

The initial stage of a tokamak discharge may be divided into three phases: breakdown, plasma formation and current rise. Generally, these phenomena are all achieved using an ohmic transformer to apply a toroidal electric field. These phases directly affect the ultimate properties of the plasma in the light of the production of runaway electrons, impurity, equilibrium, stability, etc. To optimise these plasma parameters, it is, therefore, necessary to optimise these initial phases. As is well known, a long pre-breakdown phase with a high loop voltage not only produces runaway electrons in bulk to influence the character of the discharge later, but also consumes a lot of valuable volt-seconds and potentially can generate harmful hard X-rays (HXR). Many tokamaks employ special pre-ionisation systems in order to control the breakdown of prefilled gases.

There are several well established methods to produce pre-ionisation of the gas or to assist pre-ionisation in combination with the applied loop voltage. An accurate and efficient technique is based on the injection of high power microwaves in the vacuum vessel. If microwaves with a frequency corresponding to the electron cyclotron resonance (ECR) or its harmonics are present inside the vessel and if the microwave power exceeds the breakdown threshold, then electron overlaunch can be readily achieved at the ECR layer. The advantages of this method are as follows:
 1. It is very localised around the ECR layer. The radial position of this layer is totally defined by the applied toroidal magnetic field and the microwave frequency;
 2. It may produce very clean fore-plasma if the ECR layer doesn't interact with vessel walls;
 3. It allows very precise timing of the breakdown and plasma initiation;
 4. All the hardware is usually external and can be placed quite remote from the machine.

However, there are several problems specific to this technique. First, because of the resonant nature of ECR breakdown, the presence of ECR or its harmonics inside the vessel is needed. This means that for any chosen microwave frequency there will be a limited range of magnetic field values providing ECR within the vessel. A second problem is the relatively high cost of ECR systems. Typically, for reliable ECR breakdown in a high field (B>1T) tokamak, one would need a microwave source with a frequency higher than 28 GHz and the output power in the range of tens of kW. Such a system would cost over £100 k. Usually application of the ECR breakdown is beneficial if the microwave hardware can be used for other purposes such as plasma heating and current drive, for example.

An alternative approach is to employ a low power electron source (hot filament) or a plasma source inside the vessel allowing ionised gas to fill the whole volume due to electron drifts. RF plasma sources usually produce cleaner plasma than DC-powered plasma sources. RF plasma generators at 13.56 MHz (and its harmonics) are widely used in industry. To achieve breakdown within the range of typical gas pre-fill pressures in a tokamak, typically $10^{-1}$-$10^{-4}$ mbar, RF power of <1 kW may be sufficient.

SUMMARY OF THE INVENTION

According to a first aspect of the present invention, there is provided an apparatus for protecting an interior surface of a fusion reactor vessel. The apparatus comprises a power supply operably connected to an electrode for insertion into the vessel. The apparatus supports a solid material within the vessel, and is configured such that power supplied to the electrode within the vessel causes a plasma located in proximity to the solid material to sputter the solid material in order to deposit a protective material on said interior surface.

According to a second aspect of the present invention, there is provided a method for protecting an interior surface of a fusion reactor vessel. The method comprises providing DC or RF power in order to cause a plasma to sputter a solid material located within the vessel to deposit a protective material on said surface.

According to a third aspect of the present invention, there is provided an apparatus for generating a plasma in a fusion device. The apparatus comprises one or more filaments operably coupled to one or more power supplies and a radiofrequency, RF, electrode operably coupled to an RF power supply. The one or more filaments are configured to provide electrons into a chamber of the fusion device, and the RF electrode is configured to generate a plasma within the chamber.

According to a fourth aspect of the present invention, there is provided a method for generating a plasma in a fusion device. The method comprises generating a radiofrequency, RF, discharge in the reactor vessel of the device whilst supplying current to a filament housed within a reactor vessel of the fusion device.

According to a fifth aspect of the present invention, there is provided an assembly comprising an apparatus according the first aspect and an apparatus according to the third aspect, wherein both apparatuses are mounted on a single support arm.

According to a final aspect of the present invention, there is provided a fusion reactor comprising a reactor vessel and an apparatus according to the first, third, or fifth aspect.

Further embodiments are presented in claim 2 et seq.

BRIEF DESCRIPTION OF THE DRAWINGS

Some preferred embodiments of the invention will now be described by way of example only and with reference to the accompanying drawings, in which.

DETAILED DESCRIPTION

Vessel Wall Conditioning

Rather than using evaporation or CVD deposition techniques, boronisation and lithiumisation can instead be achieved by plasma sputtering. In plasma sputtering, a low pressure plasma is formed immediately above the material to be sputtered (the "target") using an RF voltage which is applied to the a conducting plate behind the target. A conductive grid adjacent to the target may be used to assist the creation of the plasma by providing a conducting surface close to the plasma. If the target is conductive, a DC voltage may be used instead (a non-conductive target would build up charge if a DC voltage was used). The RF or DC voltage is set up such that positive ions of the plasma are accelerated towards the target. For DC, this is done by negatively biasing the target. Some DC bias may also be applied in addition to supplied RF power. Where a mesh is used, the ions are accelerated towards and through the mesh, causing them to impact the target. The positive ions kinetically eject ("sputter") atoms from the surface of the target.

Figure 1:
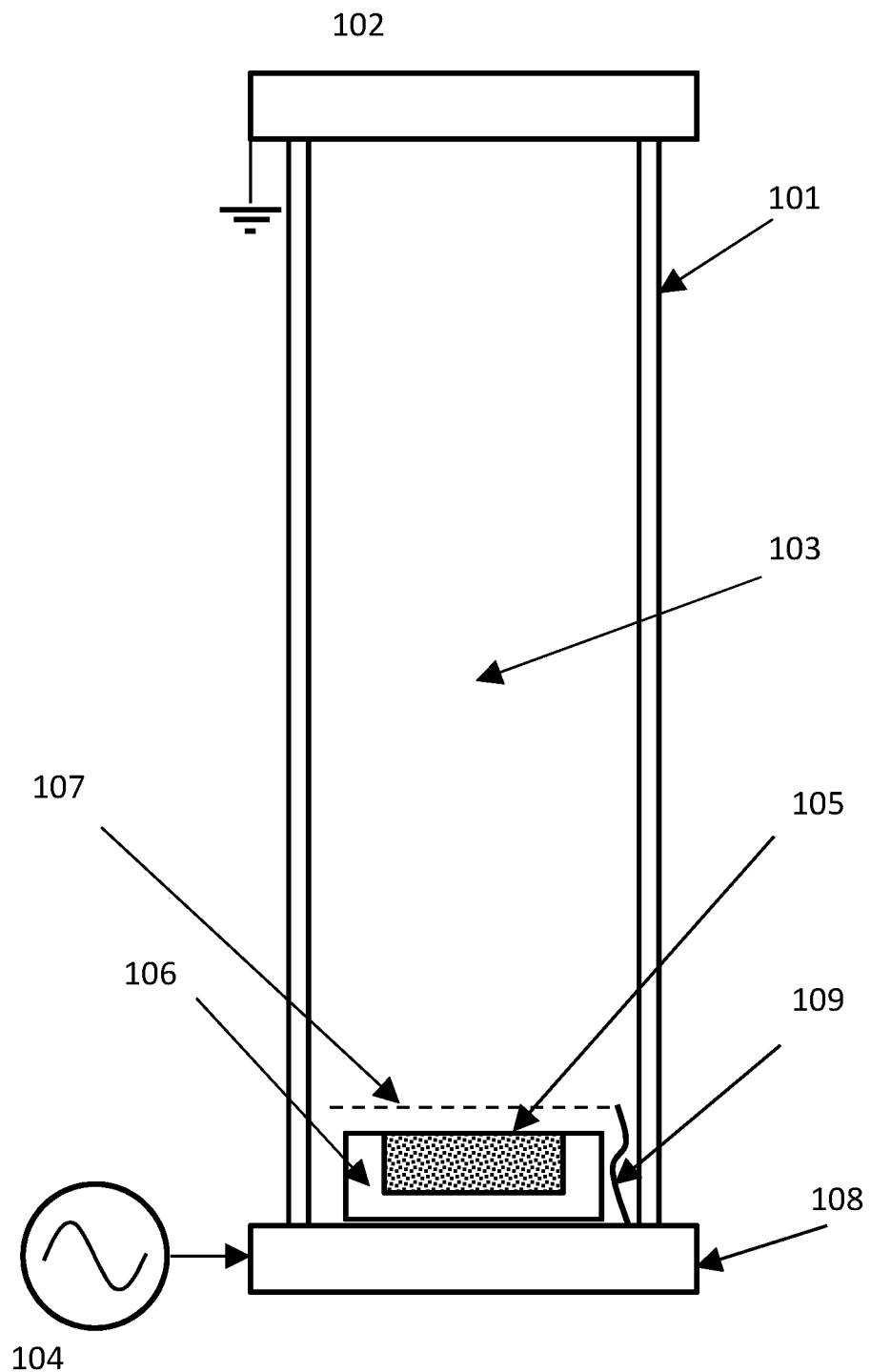
FIG. 1 shows schematically a test apparatus for depositing boron on the interior surfaces of a vessel.

FIG. 1 is a schematic view of a test system for depositing boron on the interior surfaces of a vessel 101 by plasma sputtering. This experiment was performed as a proof of concept of boronisation by plasma sputtering. The test apparatus comprises a vessel 101 (e.g. a glass tube) with an earthed flange 102, an RF power supply 104, a crystalline boron target 105 held within a boron nitride crucible 106, and a tungsten mesh 107 located immediately above the crucible and connected to the RF power supply 104 via a flange 108 and wire 109.

In use, low pressure ($10^{-1}$ to $10^{-2}$ mbar) helium gas 103 is introduced into the vessel and RF power is supplied to the mesh 107 from the RF power supply 104 to ignite a discharge adjacent to the target 105. Ions and/or electrons formed in the plasma of the discharge are accelerated into the surface of the boron nitride, thereby causing boron to be sputtered into the vessel. The system can also be used with a boron nitride target instead of or as well as crystalline boron. It is also possible to deposit lithium on the walls of the vessel using lithium in the test apparatus instead of or in addition to boron or BN. If lithium is used it is not necessary to use a tungsten mesh since the RF current can be supplied directly into the lithium.

The apparatus can be scaled up by using more than one crucible and mesh, each holding a target. Meshes made from conducting materials other than tungsten can be used, but the material must be able to withstand exposure to an RF discharge and have a low sputtering coefficient (i.e. be difficult to sputter) to prevent the mesh itself being eroded by sputtering or contaminating the vessel.

RF discharge deposition method for boronisation was tested in the experimental set-up. A few grams of crystalline boron were placed into a dish made of boron nitride (BN) as shown in FIG. 1. A tungsten mesh 107 was used to provide electrical contact close to the boron crystals 105, in order to accelerate ions of the plasma into the boron crystals. The mesh was connected to a flange 108 which itself was connected to an impedance matching unit and RF power supply 104. The flange 108 was used to seal a glass vacuum vessel 101. An extra pure (99.9%) He gas was delivered through a liquid nitrogen trap into the vessel and the base pressure maintained at about 0.25 mbar. RF breakdown was readily achieved under these conditions and the colour of the plasma was almost white with a light pink tone which is quite typical for GDC in pure He. A stable discharge condition was established at about 50 W of coupled RF power. A sky blue colour was observed in the vicinity of the boron crystals, indicating the presence of ionized boron atoms. The identity of the boron spectral line was confirmed with a spectrometer. After about 3 hours of operating the RF discharge, the glass of the vacuum vessel 101 was covered with a thin brown-coloured film of boron.

In another experiment, the BN dish and crystalline boron was replaced with a Li rod about 10 mm in diameter and 10 mm long. An extra pure (99.9%) He gas was delivered through the liquid nitrogen trap into the glass vacuum vessel and the base pressure maintained at about 0.2 mbar. After 15 minutes of continuous RF discharge the colour of the plasma started to change, first at the lower part of the vessel. The plasma turned green close to the Li rod and this green area was gradually expanded upwards. After about 1 hour of continuous discharge the plasma developed a light green tone along the whole tube with the deep green in the lower half.

The green colour of the discharge is a clear evidence of predominant presence of Li ions in the plasma. According to theory, in a settled RF discharge the live electrode is self-biased to negative potential of several hundred (about −900 V in our case) volts. Helium ions are accelerated by this potential and bombard the Li target. High energy bombardment causes two main effects: the first is a secondary electron emission which keeps high negative potential and the second is Li sublimation. The efficiency of Li sublimation is not very high. Only about 5% of RF energy goes into sublimation, while most of the energy goes into heating the Li target. Lithium atoms leave the target predominantly as neutral atoms with thermal velocities. A good confirmation of this theoretical prediction is a very distinctive crimson colour surrounding the Li target. That is a typical colour of Li flames where Li atoms are excited but not ionized.

After about 3 hours of continuous glow the RF discharge was stopped for further investigation. A thin metallic deposition could be seen on all inner surfaces. Also tiny droplets of Li were clearly visible in the vicinity of the Li target. After weighing the Li sample it was concluded that at least 10 mg of Li was sputtered-evaporated during a 3-hour RF glow discharge in He.

Figure 2:
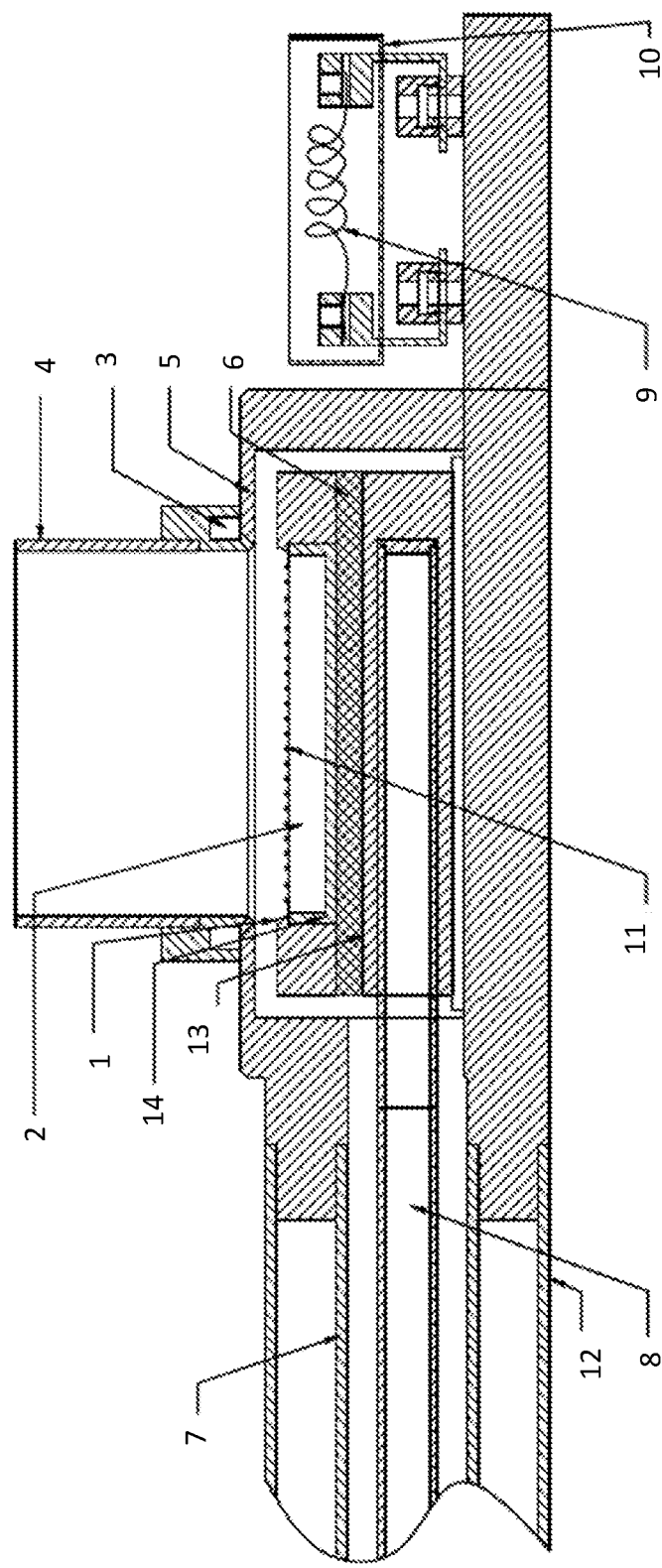
FIG. 2 shows schematically an apparatus for depositing boron or lithium on the interior surfaces of a fusion reactor vessel.

An exemplary apparatus for plasma sputtering of lithium or boron within a vessel, e.g. a plasma chamber, is shown in FIG. 2. The apparatus comprises an RF electrode 1 in comprising a clamping ring, which retains either a shallow crucible 14 made of a conducting material (e.g. graphite) and containing a target 2, or a solid target 2. The RF electrode also comprises a portion underneath the target. RF power is supplied to the electrode via a transfer arm 12 comprising a rigid coaxial cable 7. The target may be crystalline boron or metallic lithium depending on whether boronisation or lithiumisation is required. The crucible can be installed horizontally to keep the target inside the crucible with the help of gravity. In the case of boron, plasma formation and density may be assisted by a conductive mesh-type electrode 11, which may be made of tungsten and can be located on the top of the boron slab to assist the RF discharge. The sputtering rate may be increased by providing an increased concentration of plasma immediately above the target. To this end, a gas dosing ring 3 is configured to increase the localised gas pressure immediately above the target. A chimney 4 may be provided to further increase the local pressure by preventing the escape of the gas. However, the chimney will restrict the solid angle of the sputtering, so it may be absent or removable. Similarly, the faraday shield 5 may be removable. The crucible may also have a lid (not shown) which could be used to protect or seal the contents of the dish when the apparatus is not in use or when the apparatus is exposed to the atmosphere, e.g. when there is a loss of vacuum within the reaction vessel. Sealing the crucible with a lid may, for example, avoid or reduce oxidation or reaction of the lithium. In one example, the lid can be manipulated from outside the reaction vessel.

In order to control the temperature of the apparatus, water cooling 8 may be provided both to counteract heat from the sputtering and heat due to losses in the rigid coaxial cable. Lithium can be delivered into and/or removed from the dish as a liquid via a heated feeding pipe.

For conductive targets, either RF or DC sputtering may be used—DC power may be supplied via the rigid coaxial cable 7, or by a separate connection. DC sputtering is generally faster than RF sputtering, but it only works for conductive targets. RF sputtering will work for any target (though a conductive mesh may be helpful for non-conductive targets), as the RF plasma provides both ions for sputtering, and electrons which neutralise the charge accumulating in the target (for a conductive target, this charge would conduct away). RF sputtering may be enhanced with a DC bias voltage to improve the sputter rate.

Typically, for boronisation and lithiumisation, DC sputtering would only be used for lithium, as boron is not conductive. RF sputtering may be used for lithium if the RF plasma is desirable for other reasons (e.g. GDC). Boron is an insulator at room temperature—however, its resistivity drops sharply with temperature—by about 5 orders of magnitude from room temperature to 200° C. Therefore, if the boron is heated to above approximately 200 degrees, then DC sputtering can be used (and the mesh 11 is not required). To achieve this, the apparatus may comprise a heater 6 for heating the target and a thermocouple 13 for monitoring the temperature of the target. Providing the heater 6 also allows the same apparatus to be used for thermal evaporation of lithium, as an alternative to sputtering.

An electron source (e.g. a dispenser cathode) 9 and beam forming electrode 10 may be provided to initiate the sputtering plasma and/or help to sustain GDC.

RF power can be supplied to the apparatus using an impedance matching unit. As an example, an RF generator can be used, delivering up to 1 kW of RF power at 13.56 MHz. The parameters of the RF power, including any biasing, can of course be varied.

The sputter rate may be enhanced by the use of a magnetic field (e.g. generated by electromagnets or permanent magnets provided in the apparatus) to partially confine the electrons in the plasma above the sputtering target. However, this is generally not preferred in a tokamak as it may interfere with other magnetic confinement systems in operation.

Conventional buffer gas for GDC in tokamaks is helium. Helium may be used for sputtering of lithium or boron. The sputter rate may be enhanced by several (5-6) times by the use of a heavier noble gas as a buffer gas instead of helium. Argon is one of the potential candidates for this role.

The pressures used for sputtering (typically $10^{-1}$ to $10^{-4}$ mbar) overlap with those used for GDC ($10^{-2}$ to $10^{-3}$ mbar). The plasma used for sputtering may be used to seed the GDC plasma, and to sustain the GDC plasma at a lower pressure than would normally be possible. This effect is particularly pronounced for RF sputtering. This is advantageous, as using a lower pressure for GDC brings the GDC pressure closer to the operating pressure of the reactor, allowing a quicker transition from GDC to operation.

It is important to note that in contrast to boranes, crystalline boron or boron nitride is completely harmless and easy to handle. These materials are also much cheaper and can be stored or used for long periods without degradation. For example, it may be possible that only 100 g of solid material is sufficient to perform boronisation of the reactor vessel for a number of years. In a practical setup for coating a plasma vessel, the discharge apparatus can be left in the vessel permanently or can be inserted or removed through the port.

Figure 3:
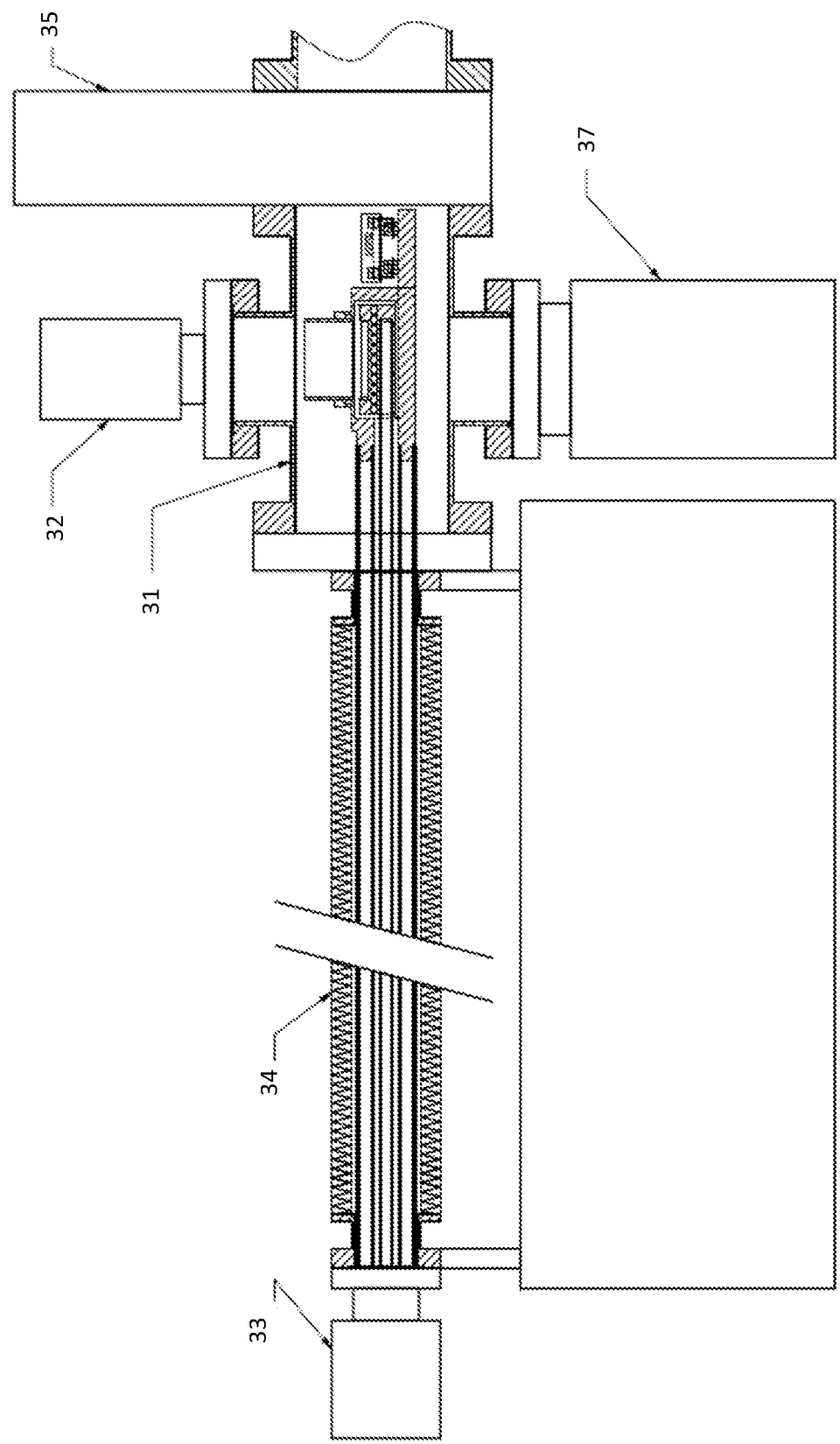
FIG. 3 shows schematically a load-lock for use as part of a fusion reactor vessel.

The apparatus may be inserted through a port in the side of the plasma chamber. To achieve the greatest solid angle for sputtering (and therefore the greatest coating uniformity), the target should be located towards the centre of the chamber (i.e. midway between the central column and the outer wall). FIG. 3 shows a system which may be provided to allow the apparatus to be withdrawn from the reactor vessel without breaking vacuum. The system comprises a load lock 31, which acts as an airlock for the reactor vessel, having a gate valve 35 on one end to allow entry to the vessel and a loading hatch (not shown—would be located "out of the page" from the sputtering apparatus in the figure) to allow adjustment of the sputtering apparatus. Pressure in the load lock 31 is controlled by means of the pressure gauge 32 and vacuum pump 37. The sputtering apparatus transfer arm is extended by means of bellows 34, and connected to feedthroughs which supply the coolant and electrical power. The load lock allows the apparatus to be withdrawn (at least sufficiently to access the target) to a place sealed from the vacuum chamber so that adjustments can be made (e.g. changing target, removing the chimney, mesh, or other optional components, etc.), and then reinserted into the chamber without breaking the reactor vacuum.

Pre-Ionisation System

RF discharges may also be useful in pre-ionisation systems. An improved pre-ionisation system for a fusion reactor may be obtained by using a low power electron source simultaneously with an RF plasma source. It is believed that the electron source generates seed electrons which are accelerated within the RF electric field to rapidly generate more electrons, thereby causing an overlaunch followed by gas breakdown.

As an example, the electron source may be same electron source as used in the sputtering apparatus described above. Alternatively, a separate electron source may be provided.

Figure 4:
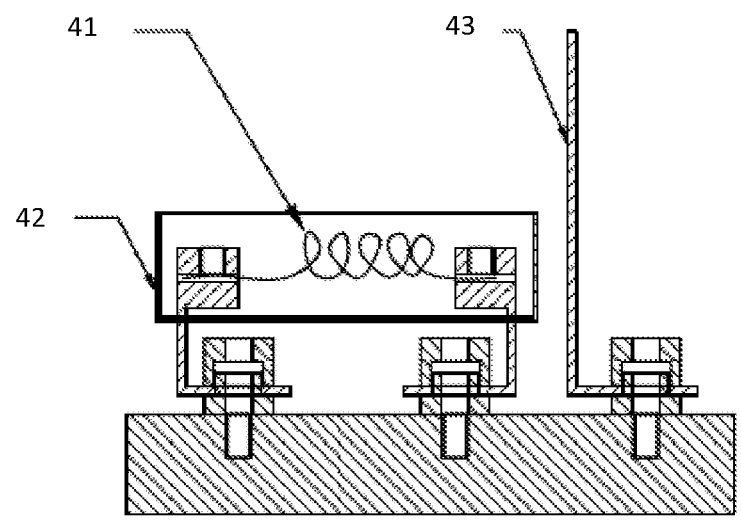
FIG. 4 shows schematically an apparatus for RF pre-ionisation within a fusion reactor vessel.

An exemplary stand-alone pre-ionisation apparatus as shown in FIG. 4 comprises an electron source 41 (e.g. a filament or dispenser cathode) and an RF electrode 43. The filament and RF electrode are connected to respective power supplies. A beam forming electrode 42 may also be used. The apparatus is configured to be inserted through a port in the side of the vacuum vessel. The apparatus is preferably located close to or even slightly within the outer wall of the vacuum vessel during pre-ionisation, to prevent it from interfering with the plasma.

As an example, during RF pre-ionisation the system may provide over 100 W of RF power at e.g. 13.56 MHz or 27.12 MHz.

RF pre-ionisation systems would preferably be located on the mid-plane of the reactor for solenoid assisted startup, or in the upper and lower halves of the reactor for merging-compression startup.

As will no doubt be appreciated in light of the above description, a device has already been proposed with an electron source, RF electrode, and which is configured to be inserted into the reactor via a port—the sputtering apparatus described above. Indeed, it would be advantageous to combine the two apparatuses. The dispenser cathode 8 acts as the electron source for RF pre-ionisation, and the components which generate an RF plasma for sputtering may be used to initiate RF pre-ionisation. Alternatively, a separate RF electrode for pre-ionisation may be provided. Since the pre-ionisation should take place at the outer edge of the vessel, the apparatus may be structured so that when the sputtering elements of the apparatus (e.g. the target, heater, etc) are within the load lock, the dispenser cathode and separate RF electrode are located in a position for RF pre-ionisation.

It will be appreciated by the person of skill in the art that various modifications may be made to the above described embodiments without departing from the scope of the invention.

The invention claimed is:

1. A fusion reactor vessel plasma generating apparatus, comprising:
   a support arm configured for insertion into the reactor vessel via a port, the support arm comprising:
      an RF electrode operably coupled to an RF power supply and configured to generate a plasma when power is supplied to the RF electrode from the power supply; and
      one or more filaments operably coupled to one or more further power supplies, wherein the one or more filaments are configured to provide electrons to the plasma,
   wherein the support arm places the RF electrode and the one or more filaments within an interior of the reactor vessel.

2. A fusion reactor vessel plasma generating method, comprising:
   inserting a support arm through a port in the reactor vessel;
   generating a plasma with an RF discharge of an RF electrode supported on the support arm and within the reactor vessel, the RF electrode operably coupled to an RF power supply; and
   concurrently with the generating, supplying a current to a filament on the support arm and within the reactor vessel and providing electrons from the filament to the plasma.

3. A fusion reactor vessel sputtering assembly comprising:
   a support arm configured for insertion into the reactor vessel via a port, arm comprising:
      an RF electrode operably coupled to an RF power supply and configured to generate a plasma when power is supplied to the RF electrode from the power supply;
      a crucible supporting a material, the crucible operatively coupled to the RF electrode, such that the plasma generated by the RF electrode sputters the material; and
      one or more filaments operably coupled to one or more further power supplies, wherein the one or more filaments are configured to provide electrons to the plasma,
   wherein the support arm places the RF electrode, the crucible, and the one or more filaments within an interior of the reactor vessel.

4. An assembly according to claim 3, wherein the material comprises a boron-containing molecule.

5. An assembly according to claim 4, wherein the material comprises elemental boron or boron nitride.

6. An assembly according to claim 3, wherein the material comprises lithium.

7. An assembly according to claim 3, wherein the RF electrode comprises tungsten, graphite, or other electrically conducting material.

8. An assembly according to claim 3, wherein the RF electrode comprises one or more of
   a mesh supported above the crucible or a dish in which the crucible is supported.

9. An assembly according to claim 8, wherein the RF electrode comprises the mesh and the dish.

10. An assembly according to claim 3, further comprising a gas dispenser configured to increase a local pressure in the vicinity of the RF electrode.

11. An assembly according to claim 3, further comprising a chimney located above the RF electrode.

12. A fusion reactor vessel comprising: a reactor vessel having a port and the assembly according to claim 3.

* * * * *